United States Patent [19]

Shinoda et al.

[11] Patent Number: 4,802,135
[45] Date of Patent: Jan. 31, 1989

[54] SEMICONDUCTOR MEMORY HAVING MULTIPLE CONTINUOUS ACCESS FUNCTIONS

[75] Inventors: Takashi Shinoda; Masamichi Ishihara, both of Tokyo, Japan

[73] Assignee: Hitachi, Ltd., Tokyo, Japan

[21] Appl. No.: 902,564

[22] Filed: Sep. 2, 1986

[30] Foreign Application Priority Data

Aug. 30, 1985 [JP] Japan ................... 60-189502

[51] Int. Cl.⁴ .................. G11C 11/40; G11C 7/00
[52] U.S. Cl. ......................... 365/233; 365/230; 365/189
[58] Field of Search ............ 365/233, 230, 189, 239, 365/240

[56] References Cited

U.S. PATENT DOCUMENTS

| | | | |
|---|---|---|---|
| 4,476,548 | 10/1984 | Matsumoto et al. | 365/233 X |
| 4,562,555 | 12/1985 | Ouchi et al. | 365/233 X |
| 4,677,592 | 6/1987 | Sakurai et al. | 365/230 |
| 4,683,555 | 8/1987 | Pinkham | 365/189 |
| 4,685,089 | 8/1987 | Patel et al. | 365/189 |
| 4,706,219 | 11/1987 | Miyata et al. | 365/189 X |

*Primary Examiner*—Stuart N. Hecker
*Assistant Examiner*—Alfonso Garcia
*Attorney, Agent, or Firm*—Antonelli, Terry & Wands

[57] ABSTRACT

A pseudo static RAM is provided which uses a one MOSFET dynamic RAM cell, in which two functions of a page mode and a static column mode are realized by using an address buffer having a function to transmit address signals fed from external terminals as they are and a latch function to latch the address signals fed from the external terminals in synchronism with predetermined control signals fed from the external terminals. The address buffer also has a multiplexer function to selectively incorporate the address signals from the external terminals and the address signals produced in the inside of the RAM so that the address buffer and an internal address signal generating circuit may be controlled by external control terminals to make possible the continuous access by the internal address signals.

10 Claims, 5 Drawing Sheets

SEMICONDUCTOR MEMORY HAVING MULTIPLE CONTINUOUS ACCESS FUNCTIONS

BACKGROUND OF THE INVENTION

The present invention relates to a semiconductor memory and, more particularly, to a technique which is effective when applied to a dynamic RAM (i.e., Random Access Memory) having its peripheral circuits of the static type.

The page mode is well known in the art as a continuous access operation in the dynamic RAM. The page mode executes the continuous read/write operations of memory cells coupled to one word line by changing a column address signal in synchronism with a column address strobe signal $\overline{CAS}$, while the word line is being selected by a row selector, to sequentially switch data lines. There is also known in the art a static column mode, in which a column selector is constructed of a static type so that the continuous read/write operations of the aforementioned memory cells coupled to the word line may be executed by changing the column address signals, while the word line is being selected, to sequentially switch the data lines.

The above-mentioned page mode can carry out continuous access at a relatively high speed because address signals fed from the outside are incorporated by using the column address strobe signal as a clock. However, the page mode makes it necessary to feed a clock signal from the external terminals. The latter mentioned column static mode makes the continuous access possible merely by changing the column address signal. However, the column static mode is caused to have a relatively slow operation speed by the skew (i.e., the changing timing difference of the address signal) of the address signal fed from the external terminals. In other words, the column selecting operation is effected in accordance with that one of the address signals of multiple bits which will change most slowly. Thus, the two modes both have merits and demerits, and the dynamic RAM of the prior art has functions in either of the modes.

Incidentally, a dynamic RAM having the aforementioned continuous access function can be referred to in either pp. 169 to 193 of the Magazine "Nikkei Electronics" issued on July 18, 1983 by NIKKEI McGRAW-HILL (which generally discusses high integration one MOSFET D-RAMs) or the "Hitachi IC Memory Data Book" issued in Sept. 1983 by Hitachi, Ltd. (which particularly shows both page and static column modes).

SUMMARY OF THE INVENTION

An object of the present invention is to provide a semiconductor memory which is contemplated to have multiple functions and high-speed operations.

The above-specified and other objects and the novel features of the present invention will become apparent from the following description taken with reference to the accompanying drawings.

A representative example of the invention to be disclosed herein will be briefly described in the following.

An address buffer having a function to transmit address signals fed from external terminals as they are and a latch function to latch the address signals fed from the external terminals in synchronism with predetermined control signals fed from the external terminals is used to realize the two functions of a page mode and a static column mode. The address buffer is given a multiplexer function to incorporate the address signals from the external terminals and the address signals produced in the inside of the RAM selectively so that the address buffer and an internal address signal generating circuit may be controlled by external control terminals to make possible the continuous access by the internal address signals.

DESCRIPTION OF THE PREFERRED EMBODIMENTS

Figure 1:
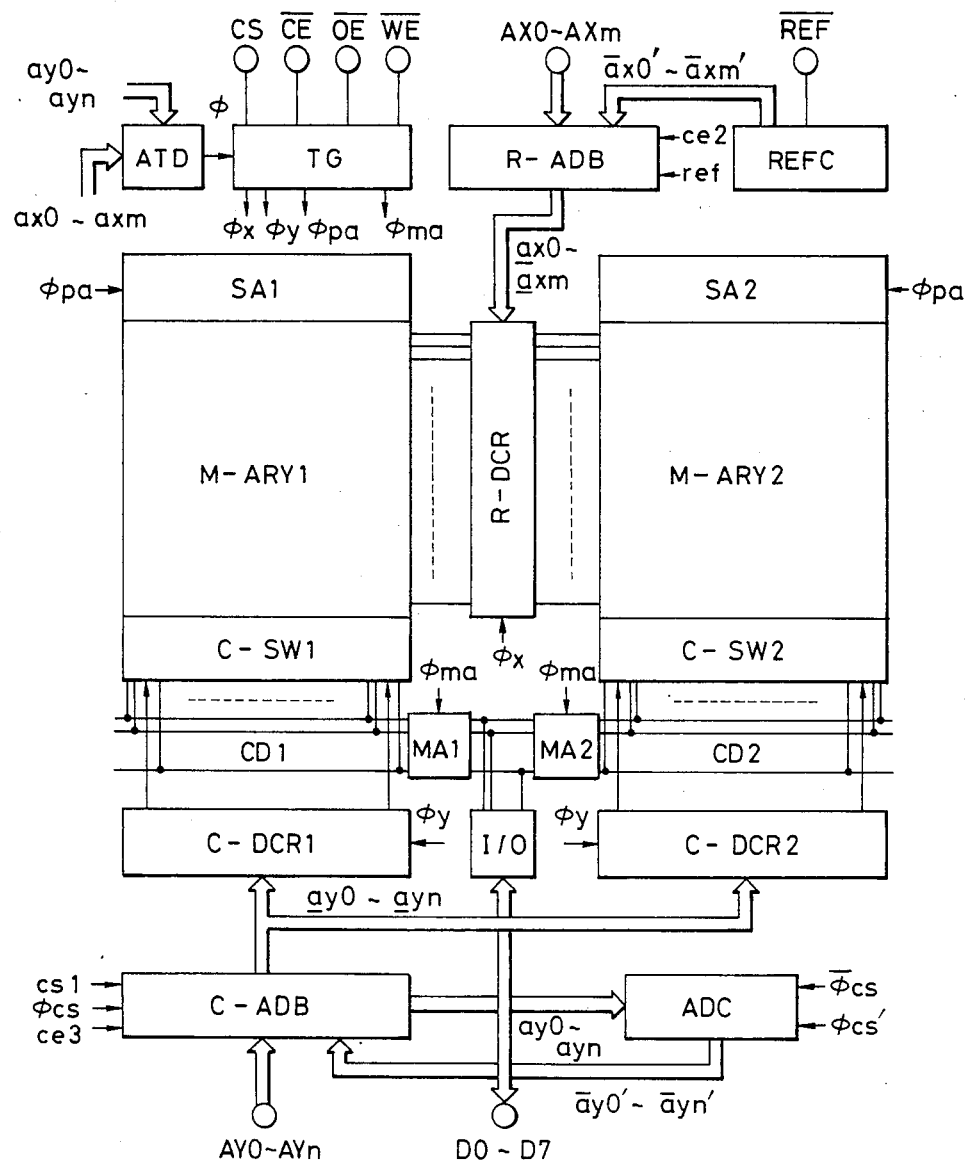
FIG. 1 is a block diagram showing the internal structure of one embodiment of a pseudo static RAM according to invention.

FIG. 1 shows a block diagram showing a pseudo static RAM according to one embodiment of the present invention. This pseudo static RAM of FIG. 1 is formed, although not especially limitative, on a substrate of a semiconductor such as single-crystalline silicon by the well-known technique for fabricating a semiconductor integrated circuit. In the pseudo static RAM of FIG. 1, each memory cell is constructed of the well-known one MOSFET (i.e., Metal Oxide Semiconductor Field Effect Transistor) dynamic RAM cell, as will be described hereinafter in more detail. On the other hand, row address signals and column address signals are not multiplexed but fed from external terminals made independent of one another and are incorporated in synchronism with chip selection signals. Moreover, the memory cell is accessed at a unit of eight bits. In the pseudo static RAM of FIG. 1, a semiconductor memory which is generally accepted to be substantially identical to a static RAM for inputs and outputs at the 8-bit unit is constructed of a dynamic RAM.

In the present embodiment, although not especially limitative, two memory arrays are separately arranged at right and left sides, as denoted at M-ARY1 and M-ARY2. In each memory array M-ARY1 or M-ARY2, eight complementary data line couples are grouped into one and are formed to run longitudinally of FIG. 1. More specifically, the memory array is not constructed into eight blocks (or mats), but the data lines of 8 bits, i.e., the adjoining eight complementary data line couples in one memory array are assigned one address and are transversely arranged in FIG. 1. This arrangement can simplify the memory array and its peripheral circuits.

Row address selection lines (i.e., word lines) are formed to run transversely of FIG. 1 in each of the aforementioned memory arrays M-ARY1 and M-ARY2.

The aforementioned complementary data line couples are selectively connected through column switches C-SW1 and C-SW2 with common complementary data line couples CD1 and CD2. In FIG. 1, the aforementioned common complementary data line couples run transversely. These common complementary data line couples CD1 and CD2 are connected with the respective input terminals of main amplifiers MA1 and MA2.

Sense amplifiers SA1 and SA2 are made receptive of fine read voltages of the complementary data line couples of the aforementioned memory arrays so that they are brought into operative states in response to their timing signals $\phi_{pa}$ to amplify the complementary data line couples to high/low levels in accordance with the aforementioned read voltages.

A row address buffer R-ADB is rendered operative by a timing signal ce2, which is generated on the basis of a chip selection signal $\overline{CE}$, and is made receptive of row address signals AX0 to AXm of (m+1) bits fed from external terminals, to produce internal complementary address signals ax0 to axm and $\overline{ax0}$ to $\overline{axm}$ and send them out to a row address decoder R-DCR. In the following description and drawings, incidentally, a couple of internal complementary address signals, e.g., ax0 and $\overline{ax0}$ will be denoted together by internal complementary address signals ax0. Therefore, the aforementioned internal complementary address signals ax0 to axm and $\overline{ax0}$ to $\overline{axm}$ will be denoted by internal complementary address signals ax0 to axm. In accordance with the aforementioned address signals ax0 to axm, the row address decoder R-DCR selects one word line in synchronism with a word line selection timing signal $\phi x$.

In order to realize three kinds of continuous access modes, as will be described hereinafter, a column address buffer C-ADB is rendered operative by a timing signal ce3, which is produced on the basis of the chip selection signal $\overline{CE}$, and is given: a function to transmit column address signals AY0 to AYn of (n+1) bits fed from external terminals as they are; a latch function to latch the address signals AY0 to AYn in synchronism with the edge of an later-described internal control signal $\phi_{cs}$; and a multiplexer function to receive address signals ay0' to ayn' which are produced by a later-described address counter circuit ADC. In accordance with the denotations of the aforementioned internal complementary address signals, incidentally, internal complementary address signals ay0 to ayn and $\overline{ay0}$ to $\overline{ayn}$ will be denoted by internal complementary address signals ay0 to ayn in the following drawings and description.

The internal complementary address signals ay0 to ayn produced by the column address buffer C-ADB are transmitted to a column decoder C-DCR. This column decoder C-DCR has its operations controlled by a data line selection timing signal $\phi_y$ to decode the address signal transmitted thereto thereby to select one group of eight complementary data lines in synchronism with the data line selection timing signals $\phi_y$.

In response to the aforementioned data line selection signal, the column switches C-SW1 and C-SW2 connect the aforementioned eight couples of complementary data lines with corresponding eight pairs of common complementary data lines. In order to simplify the presentations, incidentally, the aforementioned complementary data line couples and common complementary data line couples are shown by a single line in FIG. 1.

An input/output circuit I/O is constructed of a read data output buffer and a write data input buffer. The former data output buffer is rendered operative when in its reading operation by a timing signal, which is produced on the basis of an output enable signal $\overline{OE}$, to amplify the output signal of one main amplifier MA1 or MA2 rendered operative and to output the amplified signal to external terminals D0 to D7. On the other hand, the latter data input buffer is rendered operative when in the writing operation by a timing signal, which is produced on the basis of a write enable signal $\overline{WE}$, to feed the write signal from the external terminals D0 to D7 to the aforementioned common complementary data line couple CD1 or CD2.

The read data output buffer and the write data input buffer have a 3-state output function, and are made to have their output high-impedance (or floating) state in their non-operative state.

The internal control signal generating circuit TG is made receptive of four external control signals $\overline{CE}$ (i.e., chip enable signal), $\overline{WE}$ (i.e., write enable signal), $\overline{OE}$ (i.e., output enable signal) and CS (i.e., clocked serial signal) to produce and send out a variety of timing signals necessary for memory operations according to the operation modes. For example, timing signals $\phi_x$, $\phi_y$, $\phi_{pc}$ and $\phi_{pa}$ are produced on the basis of the breaking timing of the chip enable signal $\overline{CE}$. Although not especially limitative, moreover, a timing signal $\phi_{ma}$ for the operations of a main amplifier MA is produced on the basis of a detection signal $\phi$ which is produced by an address signal change detecting circuit ATD made receptive of the aforementioned address signals ax0 to axm and ay0 to ayn. Generation of these signals $\phi_x$, $\phi_y$, $\phi_{pa}$, $\phi_{pc}$ and $\phi_{ma}$ is accomplished using well-known circuit arrangements (e.g. using delay circuits to generate these signals as delay signals of $\overline{CE}$) for this purpose, so further details regarding this are omitted for drawing simplification. As a result, the main amplifier can be operated only for a predetermined period after the change of the address signals to reduce the power consumption. As will be described hereinafter with reference to FIG. 6, still moreover, a variety of other timing signals for the operations of the row and column address buffer circuits R-ADB and C-ADB, the address counter circuit ADC and an automatic refresh circuit REFC are also produced by the timing generator TG on the basis of the signals $\overline{CE}$ and CS. The signals for the operations of the input/output circuit I/O are produced on the basis of the signals $\overline{WE}$ and $\overline{OE}$. Illustration of these various signals is omitted from FIG. 1 for drawing simplification.

The semiconductor memory of the present invention can be accessed from the outside like a static RAM (that is to say, the so-called "pseudo static RAM" is constructed) although one MOSFET dynamic RAM memory cells are used. For these operations, each of the peripheral circuits such as the aforementioned address buffers R-ADB and C-ADB and address decoders R-DCR, C-DCR1 and C-DCR2 is constructed of a CMOS (i.e., complementary MOS) static circuit. For those operations, moreover, the clocked serial signal CS is newly produced in addition to the chip enable signal $\overline{CE}$. The clocked serial signal CS is used for recognition of the operation mode and as a clock for the continuous access mode. Since all circuits except the memory array itself are static circuits, and since the signals from the timing generator are static signals, the pseudo static RAM is realized.

Although not especially limitative, the automatic refresh circuit REFC includes a refresh address counter and a timer and is started by setting the refresh signal $\overline{REF}$ fed from the external terminals at a low level. In the unselected (or stand-by) state in which an internal chip enable signal $\overline{ce}$ is set at a high level, more specifically, the refresh signal $\overline{REF}$ is set at a low level, then, the automatic refresh circuit REFC switches the multiplexers, which are disposed at the input portion of the row address buffer R-ADB, to transmit refresh address signals $\overline{ax}0'$ to $\overline{ax}m'$ produced by its internal refresh address counters to the row decoder R-DCR thereby to conduct a refreshing operation (i.e., an auto-refreshing operation) by a one-word line selection and an amplification of a sense amplifier SA. If the refresh signal $\overline{REF}$ is continuously set at the low level, moreover, the timer operates to increment the refresh address counter at each time so that a continuous refreshing operation (i.e., a self-refreshing operation) is conducted for this period.

The address counter circuit ADC includes a counter circuit for generating the address signals $\overline{ay}0'$ to $\overline{ay}n'$ for performing one of the continuous access modes. The counter circuit incorporates the address signals ay0 to ayn as its initial values in synchronism with a timing signal $\phi'_{cs}$ and is incremented by a signal $\overline{\phi}_{cs}$ which is produced on the basis of the clocked serial signal CS, to produce the aforementioned signals $\overline{ay}0'$ to $\overline{ay}n'$.

Figure 2:
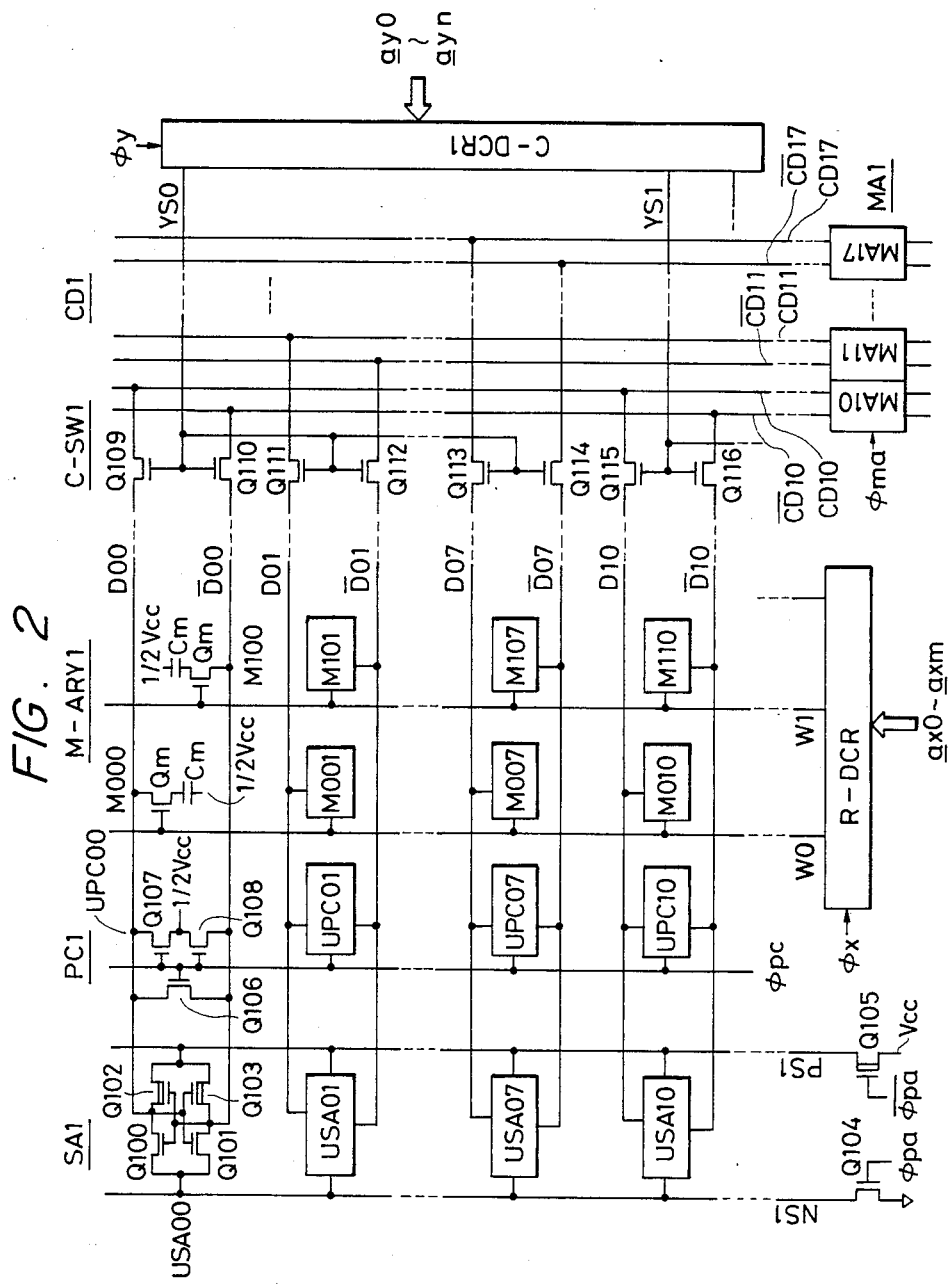
FIG. 2 a circuit diagram showing a memory cell array and peripheral circuits of the pseudo static RAM of FIG. 1 constructed to use one MOSFET dynamic RAM cells.

FIG. 2 shows the one memory array M-ARY1 of the pseudo static RAM and its corresponding circuits of FIG. 1. The other memory array M-ARY2 and its corresponding circuits are made to have the same constructions as those shown in FIG. 2, and their descriptions are accordingly omitted.

One memory cell, e.g., M000 is composed of the known one MOSFET dynamic RAM cell, i.e., a capacitor Cm for information storage and a transfer MOSFET Qm for address selection connected in series with the former. The capacitor Cm has its one electrode supplied with a fixed potential of ½·Vcc (i.e., about one half of the source potential Vcc). A word line W0 is coupled to the gate of the MOSFET Qm, and a data line D00 is connected with the source or drain of the MOSFET Qm, which is located oppositely of the electrode connected with the capacitor Cm. The information is stored depending on how charges are stored in the capacitor Cm. The stored information is read out by rendering the MOSFET conductive to couple the capacitor Cm to one of the complementary data lines and by sensing how the potential of that data line changes in accordance with the amount of charges stored in the capacitor Cm.

The memory array M-ARY1 is made to have a folded bit line construction similar to the known dynamic RAM. A memory cell M is provided to correspond to the intersection between a pair of complementary data lines D and $\overline{D}$ and a word lines W. The memory array M-ARY1 is constructed of a plurality of complementary data lines D and $\overline{D}$, a plurality of word lines W, and a plurality of memory cells M arrayed in a matrix form. Each word line W has its one end connected with the row address decoder R-DCR which is made of a CMOS circuit having the same construction as that of the known dynamic RAM. The complementary data lines D and $\overline{D}$ have their respective one ends connected with the sense amplifier SA1 and a precharge circuit PC1 and their other ends connected with the column switch C-SW1.

In order to detect the potential change of the complementary data lines, a half precharge method is used in the present embodiment as a method for generating a reference potential for the sensing operation of the sense amplifier SA1. For this purpose, the precharge circuit PC1 is provided. This precharge circuit PC1 is composed of unit circuits UPC00 to UPC10 which are disposed to correspond to the respective complementary data lines. The unit circuit UPC00 is composed of an equalize MOSFET Q106 connected between the complementary data lines D00 and $\overline{D}$00, and precharge MOSFETs Q107 and Q108 connected between the respective data lines and the fixed potential ½ Vcc. The MOSFET Q106 shortens the complementary data lines D00 and $\overline{D}$00, which are set at the high (i.e., Vcc) and low (i.e., 0V) levels by the amplification of the sense amplifier SA1, during the interval in which the sense amplifier SA1 is kept in its inoperative state. As a result, the precharge voltage of about Vcc/2 is applied to the complementary data lines D and $\overline{D}$, respectively. The MOSFETs Q107 and Q108 are provided so as to prevent the half precharge level of the complementary data lines from being fluctuated by the bump of the source voltage Vcc at the time of amplification of the sense amplifier SA1. The voltage of ½·Vcc produced by a not-shown voltage generator is supplied through the MOSFETs Q107 and Q108. The timing signal $\phi_{pc}$ is fed to the gates of the MOSFETs Q106, Q107 and Q108.

The sense amplifier SA1 is composed, as shown, of: unit circuits USA00 to USA10 provided to correspond one-by-one to the respective data line couples; and power switch MOSFETs Q104 to Q105 provided commonly for the former. Each unit circuit is constructed, as shown, of a CMOS latch circuit of common input and output type, which is composed of P-channel MOSFETs Q102 and Q103 and N-channel MOSFETs Q100 and Q101. The MOSFETs Q102 and Q103 have their sources made common with those of another unit circuit USA, which is disposed in the same memory array M-ARY1, to construct a common source line PS1. The other MOSFETs Q100 and Q101 also have their sources made common with those of another similar unit circuit USA to construct a common source line NS1.

The aforementioned common source line PS1 is supplied with the source voltage Vcc through a P-channel MOSFET Q15, and the aforementioned common source line NS1 is supplied with the ground potential of the circuit through an N-channel MOSFET Q16. These power switch MOSFETs Q15 and Q16 have their gates fed, when the memory cell in the aforementioned memory array M-ARY1 is selected, with complementary timing signals $\phi_{pa}$ and $\overline{\phi}_{pa}$ for activating the sense amplifier SA1. As a result, the sense amplifier SA1 differentially amplifies the fine read signal, which is fed to one complementary data line from the memory cell selected, with reference to the half precharge voltage (i.e., ½ Vcc) of the other complementary data line. If no memory cell of the memory array M-ARY1 is selected in the memory access cycle, the aforementioned timing signals $\phi_{pa}$ and $\overline{\phi}_{pa}$ are not generated so that the aforementioned MOSFETs Q15 and Q16 are left in their inoperative states.

The column switch C-SW1 is composed of switch MOSFETs Q109 to Q116 which are to be switched by column selecting signals. These MOSFETs Q109 to Q116 have their gates connected with column selecting lines YS for feeding the column selecting signals from the column decoder C-DCR1.

In order to effect the input and output at a unit of 8 bits, one column selecting line e.g., YS0 is used to provide a common signal for eight pairs of complementary data lines D00 and $\overline{D00}$ to D07 and $\overline{D07}$ and is applied commonly to the gates of the MOSFETs Q109 to Q114. As a result, one address corresponding to the word line W0 and a column selecting line YS0, for example, is applied to a memory cell group M00 composed of eight memory cells M000 to M007.

The eight pairs of complementary data lines D00 and $\overline{D00}$ to D07 and $\overline{D07}$ corresponding to the one column selecting line YS0 are connected through the column switch with eight pairs of common complementary data lines CD10 and $\overline{CD10}$ to CD17 and $\overline{CD17}$. The complementary data lines corresponding to another column selecting line are also connected with the common complementary data lines CD10 and $\overline{CD10}$ to CD17 and $\overline{CD17}$.

These common complementary data lines CD10 and $\overline{CD10}$ to CD17 and $\overline{CD17}$ are coupled to respective unit circuits MA10 to MA17 of the main amplifier MA1. Each of the unit circuits Ma10 to MA17 is made to have substantially the same construction as that of the main amplifier of the known dynamic RAM.

Figure 3:
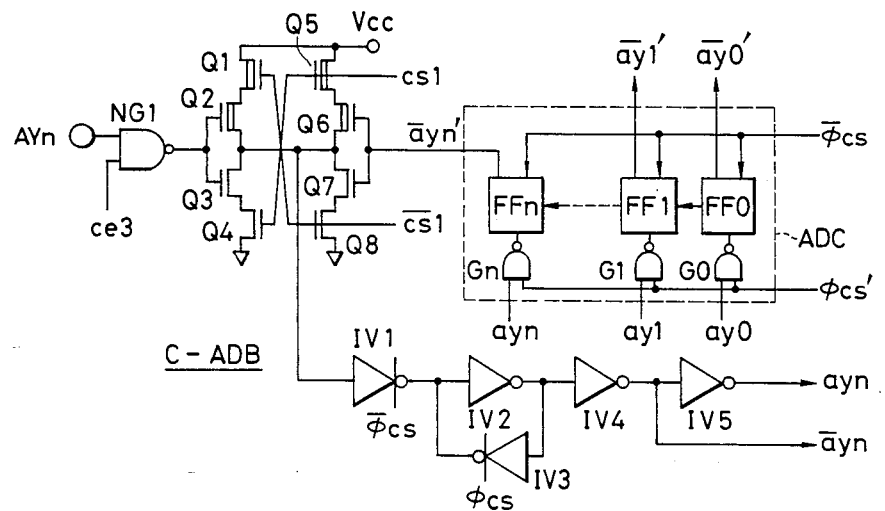
FIG. 3 is a circuit diagram showing a column address buffer and an address counter circuit of the pseudo static RAM of FIG. 1.

FIG. 3 is a circuit diagram showing the aforementioned column address buffer C-ADB and address counter ADC.

In FIG. 3, there is shown a unit circuit (i.e., a unit circuit corresponding to the address signal Ayn) of one bit of the column address buffer C-ADB. The address signal AYn fed from the external terminal AYn is fed through a NAND gate circuit NG1, which is to be controlled by the internal chip enable signal ce3 in the fastest timing, to the gate of a P-channel MOSFET Q2 and an N-channel MOSFET Q3 which serve as one input terminal of a multiplexer circuit formed of transistors Q1 to Q8. Between the source of the aforementioned P-channel MOSFET Q2 and the source voltage Vcc, there is connected a P-channel MOSFET Q1 which is made receptive of an inverse control signal $\overline{cs1}$. Between the source of the N-channel MOSFET Q3 and the ground potential of the circuit, there is connected an N-channel MOSFET Q4 which is made receptive of a control signal cs1. Incidentally, the adding of the switch MOSFETs Q1 and Q4 made receptive of the aforementioned control signals cs1 and $\overline{cs1}$ to the CMOS NAND gate circuit made receptive of the address signal AYn fed from the external terminals and the internal chip enable signal, the two circuits (i.e. one circuit formed with Q1–Q4 and another circuit formed with Q5–Q8) may be constructed into one circuit.

The gate of a P-channel MOSFET Q6 and an N-channel MOSFET Q7, i.e., another input terminal of the aforementioned multiplexer circuit is fed with a corresponding output signal ayn' of the address counter circuit ADC. These MOSFETs Q6 and Q7 are equipped with similar P-channel MOSFET Q5 and N-channel MOSFET Q8, respectively. The gates of these MOSFETs Q5 and Q8 are cross connected with the gates of the aforementioned MOSFETs Q1 and Q4 so that they are fed crossly with the aforementioned control signals cs1 and $\overline{cs1}$.

The aforementioned two circuits have their output terminals connected commonly with the input terminal of a CMOS inverter circuit IV1 which acts as an input circuit constructing a latch circuit. This inverter circuit IV1 is constructed into such a clocked inverter circuit as is rendered operative by the clock signal $\overline{\phi}_{cs}$. The output signal of the aforementioned inverter circuit IV1 is transmitted to the input terminal of a CMOS inverter circuit IV2. The output signal of this inverter circuit IV2 is fed back to the input of the same through a clocked inverter circuit IV3. This clocked inverter circuit IV3 is rendered operative by the inverter signal $\phi_{cs}$ of the aforementioned clock signal $\overline{\phi}_{cs}$. The latch circuit composed of the aforementioned inverter circuits IV1 to IV3 is made operative to incorporate the signal through the aforementioned multiplexer circuit at a timing, at which the clocked serial signal CS is changed from low level to high level in accordance with the operation mode thereof, and to act as a static circuit for transmitting the signal from the multiplexer circuit as it is as a result that the clocked inverter circuit IV1 is rendered operative whereas the clocked inverter circuit IV3 is rendered inoperative.

The output signal of the CMOS inverter circuit IV2 constructing the aforementioned latch circuit is fed to the input terminal of a CMOS inverter circuit IV4, which sends out the inverted internal address signal $\overline{ayn}$ from the output terminal of that inverter circuit IV4. The output signal of this inverter circuit IV4 is fed to the input terminal of a CMOS inverter circuit IV5, which sends out the non-inverted internal address signal ayn from the output terminal of that inverter circuit IV5.

The address counter circuit ADC is constructed of flip-flop circuits FF0 to FFn, which are connected in cascade of (n+1) steps, and NAND gate circuits G0 to Gn for feeding their outputs to the preset input terminals of the respective flip-flop circuits FF0 to FFn. The carry output of the upstream flip-flop circuit is fed to the downstream flip-flop circuit. The output of each flip-flop circuit FF0 to FFn is used as the inverted internal address signal ayo' to $\overline{ayn}'$. The clock input terminals of the respective flip-flop circuits FF0 to FFn are fed commonly to the internal signal $\overline{\phi}_{cs}$ which is produced on the basis of the clocked serial signal CS.

Figure 4:
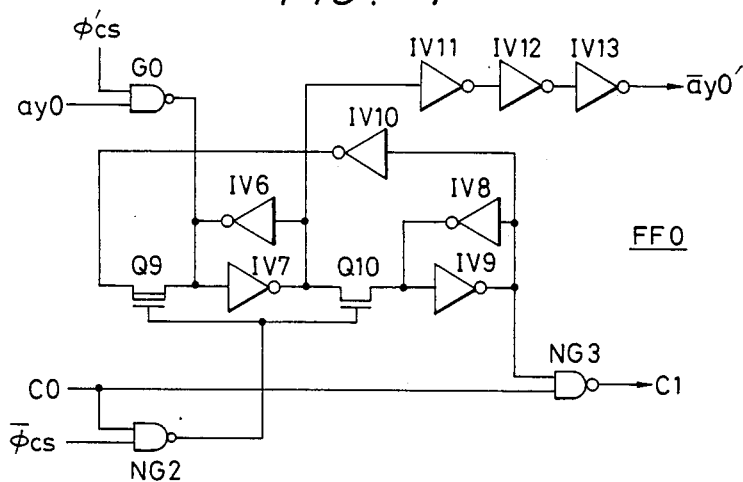
FIG. 4 is a circuit diagram showing a unit circuit constructing the address counter circuit.

The unit circuit of the address counter circuit ADC corresponding to the 1-bit address signal ay0 is shown in FIG. 4. A CMOS inverter circuit IV7 has its output signal fed back to its input through a feedback CMOS inverter circuit IV6. As a result, the CMOS inverter circuits IV7 and IV6 construct together a master flip-flop. The inverter circuit IV6 is constructed, although not especially limitative, of P-channel and N-channel MOSFETs having relatively small mutual conductances so that the signal level to be fed to the input of the inverter circuit IV7 through a MOSFET Q9 may not be controlled. The aforementioned similar CMOS inverter circuits IV9 and IV8 construct together a slave flip-flop. The output signal of the CMOS inverter circuit IV7, i.e., the output of the aforementioned master flip-flop is transmitted to the input of the CMOS inverter circuit IV9, i.e., the input of the slave flip-flop through an N-channel transmission gate MOSFET Q10. The output signal of the CMOS inverter circuit IV9, i.e., the output of that slave flip-flop is fed back through the CMOS inverter circuit IV10 and the P-channel transmission gate MOSFET Q9 to the input of the CMOS inverter circuit IV7, i.e., the input of that master flip-flop. The transmission gate MOSFETs Q9 and Q10 are fed with the output signal of a NAND gate circuit NG2. This NAND gate circuit NG2 has its one input fed with the signal $\bar{\phi}_{cs}$ as the clock input. The other input of the NAND gate circuit NG2 is fed with the carry input C0 from the upstream flip-flop circuit. Since the circuit FF0 is an initial stage circuit, the signal C0 is kept at a high level equal to the source voltage Vcc. The output signals of the NAND gate circuit NG2 and the slave flip-flop are fed to a NAND gate circuit NG3. The output of this NAND gate circuit NG3 is sent out as the carry signal C1 to the carry input terminal of a next downstream circuit FF1. The output of the master flip-flop is sent out, although not especially limitative, as the inverted internal address signal $\overline{ay0}'$ through serially connected CMOS inverter circuits IV11 to IV13. The address signal ay0 is fed as an initial value to the input of the master flip-flop. As will be described hereinafter, more specifically, the gate circuits G0 to Gn have their gates opened by the one-shot pulse $\phi_{cs}'$ generated when in a high-speed continuous operation mode. As a result, the address signals ay0 to ayn corresponding to address signals AY0 to AYn fed from the aforementioned external terminals are incorporated as initial values to the flip-flop circuits FF0 to FFn, respectively.

The address counter circuit ADC conducts its incrementing operation at the edge of the internal signal $\bar{\phi}_{cs}$, which is produced on the basis of the clocked serial signal CS, for example, when the same signal falls from the high to low levels, for example. More specifically, the address counter circuit ADC acts as a binary counter which uses the address signals ay0 to ayn as the initial values and is incremented by the signal $\bar{\phi}_{cs}$.

Figure 5:
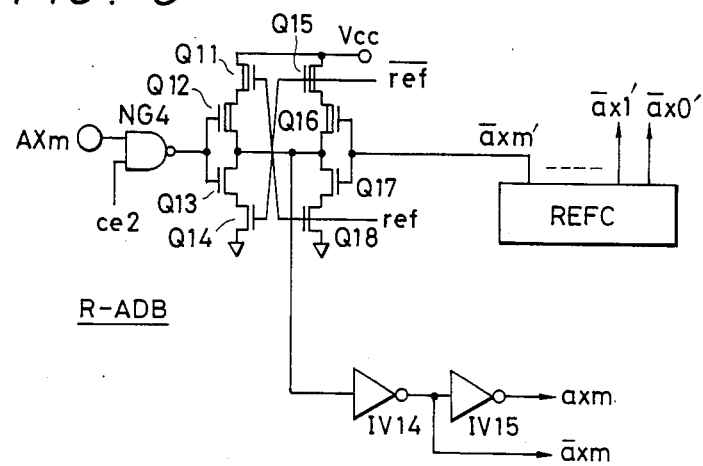
FIG. 5 is a circuit diagram showing a row address buffer of the pseudo static RAM of FIG. 1.

In FIG. 5, there is shown a unit circuit (i.e., a unit circuit corresponding to an address signal AXm) of one bit of the row address buffer R-ADB. This unit circuit is constructed into a circuit similar to the unit circuit of the aforementioned column address buffer.

The NAND gate circuit NG1 is replaced by a NAND gate circuit NG4, and the MOSFETs Q1 to Q8 are replaced by MOSFETs Q11 to Q18 of the same conductivity type, respectively. The NAND gate circuit NG4 is fed with the address signal AXm and the timing signal ce2. The signals cs1 and $\overline{cs1}$ are replaced by signals $\overline{ref}$ and ref which are produced on the basis of the refresh signal REF. The MOSFETs Q16 and Q17 constructing one of the multiplexer circuits have their gates fed with the corresponding address output $\overline{axm}'$ of the automatic refresh circuit REFC. The output of the multiplexer is outputted as the address signal axm through CMOS inverter circuits IV14 and IV15 and as the inverted address signal $\overline{axm}$ through the inverter circuit IV14.

The automatic refresh circuit REFC has substantially the same construction as that of the automatic refresh circuit of the known dynamic RAM. In the refresh mode or in the interval the signal $\overline{REF}$ is made the low level, the internal signals $\overline{ref}$ and ref, which are generated in the circuit TG, are made the low level and the high level. As a result, the multiplexer of the row address buffer R-ADB outputs the signals based on the signals $\overline{ax0}'$ to $\overline{axm}'$ fed from the automatic refresh circuit REFC to the inverter circuit IV14 in the refresh mode, whereas the multiplexer of the row address buffer R-ADB outputs the signals based on the external address signals AXo to AXm to the inverter circuit IV14 in a memory access cycle.

Figure 6:
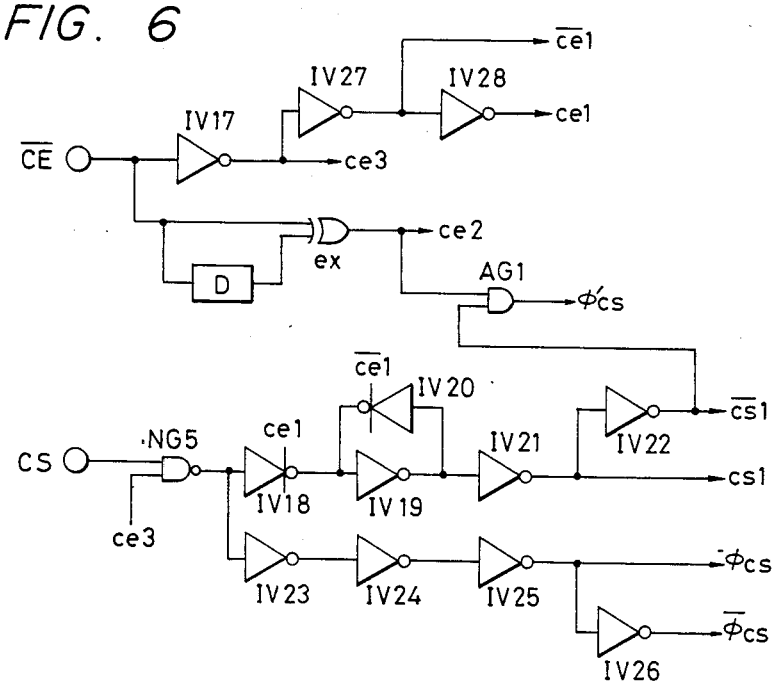
FIG. 6 is a circuit diagram showing a portion of a timing generator.

In FIG. 6, there is shown a circuit which is contained in an internal control signal generating circuit TG for generating the aforementioned various timing signals. In FIG. 6, characters IV17 to IV27 denote CMOS inverter circuits, of which the IV18 and IV20 are clocked CMOS inverter circuits. Characters AG1 and NG5 denote an AND gate circuit and a NAND gate circuit; letter D a delay circuit constructed of a plurality of CMOS inverter circuits or CR time constant circuits; and letters ex an exclusive OR gate circuit.

The internal signal ce3 in opposite phase to the signal $\overline{CE}$ is produced by the circuit IV17 from the chip enable signal $\overline{CE}$ fed from the external terminal $\overline{CE}$. With a delay of the signal ce3, the signal ce1 in phase with the signal ce3 is produced by the circuits IV27 and IV28. The internal signal $\overline{ce1}$ in phase with the signal $\overline{CE}$ is produced by the circuit IV27. The signal ce2 produced by the circuits D and ex is set at the high level only for a predetermined period, which is determined by the circuit D, after the falling of the signal $\overline{CE}$.

The clocked serial signal CS fed to the external terminal CS is incorporated through the circuit NG5 only during the chip selection period for which the signal ce3 is at its high level. The clock signal $\phi_{cs}$ in phase with the signal CS is produced from the output of the circuit NG5 by the circuits IV23 to IV25, and the clock signal $\bar{\phi}_{cs}$ in opposite phase to the signal CS is produced by the circuits IV23 to IV26.

On the other hand, the output of the circuit NG5 is fed to the input of the circuit IV18. When the chip enable signal $\overline{CE}$ is at its high level, the circuits IV18 and IV19 are rendered operating and inoperative, respectively, with the control signals ce1 and $\overline{ce1}$. In response to the fall of the chip enable signal CE, moreover, the circuits IV18 and IV19 are rendered inoperative and operative, respectively. As a result, the latch circuit constructed of the circuits IV19 and IV20 latches the level of the signal CS at the time of the fall of the signal $\overline{CE}$ until all the circuits are reset when the signal $\overline{CE}$ is made its high level again. The signal cs1 in opposite phase to the output is produced by the circuit IV21, and the signal $\overline{cs1}$ in phase with the output is produced by the circuits IV21 and IV22.

Two groups of signals are produced from the signal CS. The signals belonging to one group are the signals, which are produced by latching the signal CS at the fall of the signal e,ovs/CE/ , and are used for selecting the operation modes and for producing signals for the operation mode selected. The signals belonging to the other group are signals varying with the signal CS and are used as clocks.

The one-shot pulse $\phi'_{cs}$ for the address counter circuit ADC is obtained as the output of the circuit AG1 which is made receptive of the signals ce2 and $\overline{CS1}$. The signal $\phi'_{cs}$ is generated for a predetermined period after the fall of the signal $\overline{CE}$ in case the signal CS is at its low level at the falling timing of the signal $\overline{CE}$.

Next, with reference to the respective timing charts shown in FIGS. 7 to 9, three kinds of continuous access modes to be realized by the selective operations of the aforementioned address buffer C-ADB and address counter ADC will be described in the following.

Figure 7:
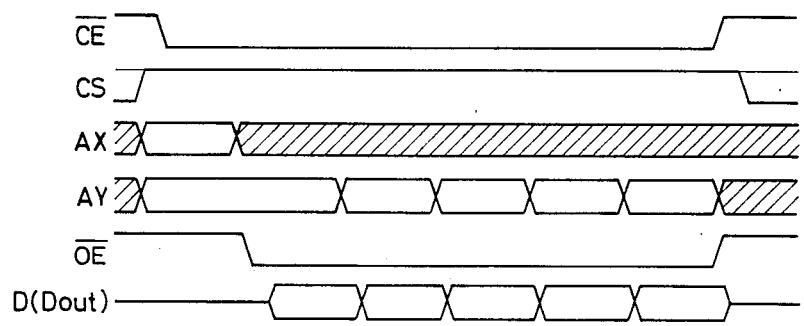
FIG. 7 is a timing chart for explaining a static column mode, i.e., one of the operations of the pseudo static RAM of FIG. 1.

In FIG. 7, there is shown a timing chart for describing the reading operation in the static column mode.

If the clocked serial signal CS is at its high level at the timing of the chip enable signal $\overline{CE}$ changing from its high to low levels, there is invited the continuous access mode by the address signals AY0 to AYn fed from the external terminals. In the static column mode, the aforementioned clocked serial signal CS is kept at its high level.

In response to the fall of the signal $\overline{CE}$, the signal ce3 is set and kept at its high level until the signal $\overline{CE}$ restores the high level. The signal ce2 is set at its high level in response to the fall of the signal $\overline{CE}$ and is dropped again to its low level after a predetermined time period. With a predetermined delay from the high level of the signal ce3, the signal ce1 is raised to its high level (whereas the signal $\overline{ce1}$ is dropped to its low level).

In response to the high level of the signal ce3, the signal CS is incorporated through the circuit NG5 into the input of the circuit IV19. In response to the high and low levels of the signals ce1 and $\overline{ce1}$, respectively, the circuits IV18 and IV19 are rendered inoperative and operative. As a result, the signals cs1 and $\overline{cs1}$ are fixed at the high and low levels, respectively.

While the signal ce2 is kept at its high level for a predetermined period, the row address is incorporated through the circuit NG4 into the row address buffer R-ADB. At this time, the circuits at the side of the external terminals AX are rendered operative by the high level of the signal $\overline{ref}$ and the low level of the signal ref, which are produced on the basis of the high level of the signal $\overline{REF}$. As a result, the internal address signals ax0 to axm are produced on the basis of external signals AX0 to AXm. The signal $\phi_x$ is raised to its high level on the basis of and with a suitable time delay from the fall of the signal $\overline{CS}$. As a result, the row address decoder R-DCR selects one word line W.

In response to the high level of the signal ce3, the column address is incorporated through the circuit NG1 into the column address buffer C-ADB. At this time, the circuit at the side of the external terminals AY is rendered operative by the high level of the signal CS1 and the low level of the signal $\overline{CS1}$. As a result, the internal address signals ay0 to ayn are produced on the basis of the external address signals AY0 to AYn. At this time, prior to the high level of the signal CS1, the clock signal $\phi_{cs}$ is raised to its high level so that the circuit IV1 is rendered operative whereas the feedback circuit IV3 is rendered inoperative. As a result, the latch circuit operates to act as a buffer circuit for transmitting its input signal as it is. The timing for the high level of the signal $\phi_{cs}$ and the timing for the high level of the signal CS1 are made substantially simultaneous. Due to a difference between these timings, however, the address signal ayn' of the previous operation may possibly be fed at the instant to the circuit IV5 or the like in response to the conductive states of the MOSFETs Q5 and Q8. However, this signal ayn' is not latched by the latch circuit, but the address signal AYn incorporated at the high level of the signal CS1 is made effective. After the internal column address has been fixed, the signal $\phi_y$ is raised to its high level on the basis of and with a suitable time delay from the fall of the signal $\overline{CE}$. As a result, the column address decoder C-DCR selects one column selecting line YS.

As a result, the selecting operations of the memory cells are conducted on the basis of the row address signals AX and the column address signal AY, which are fed from the external terminals.

Incidentally, the signal $\phi_{pa}$ is raised to its high level substantially simultaneous with the signal $\phi_x$ and on the basis of the fall of the signal $\overline{CE}$ to activate the sense amplifier SA. The signal $\phi_{ma}$ is raised to its high level substantially simultaneously with the signal $\phi_y$ and on the basis of the signal $\phi$ to activate the main amplifier MA. If the output enable signal $\overline{OE}$ is dropped to its low level when the write enable signal $\overline{WE}$ is in its reading operation at the high level, although not shown, information $D_{out}$ stored in the memory cell selected is sent out to the external terminal D. In the state where the signals $\overline{CE}$ and CS are kept at the same level, the column address signals AY (e.g., AY0 to AYn) are changed. In response to this change, the address buffer C-ADB constructed of the CMOS static circuit changes the internal address signal. The internal row address signal is not changed but is latched by the not-shown latch circuit. As a result, the column decoder C-DCR1 or C-DCR2 decodes the internal row address signal to switch the column switch circuits. At each time, the signal of the complementary data line of the memory array switched is sent out to the external terminal D. The operations thus far described are the reading ones in the static column mode. In this static column mode, the continuous access is made possible by the switch of the column addresses at an arbitrary timing. Incidentally, in the case of the writing operation, the continuous writing operation is executed by supplying a write signal Din to the external terminal D in synchronism with the changes in the aforementioned column address signals AY.

Figure 8:
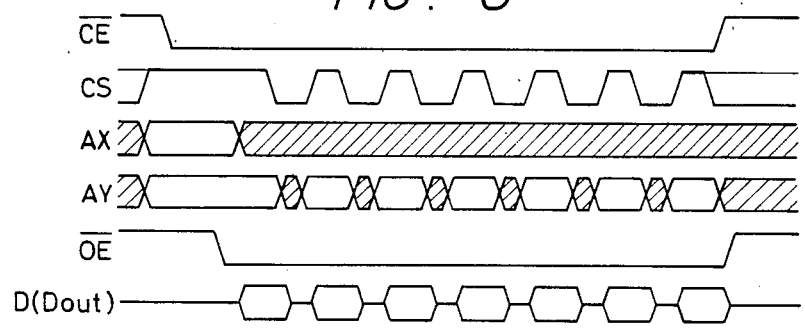
FIG. 8 is a timing chart for explaining a page mode, i.e., another operation of the pseudo static RAM of FIG. 1.

In FIG. 8, there is shown a timing chart for describing the reading operations in the page mode.

Since the signal CS is at its high level like the aforementioned operations at the timing where the chip enable signal $\overline{CE}$ changes from its high to low levels, the access mode is performed by the address signals AY0 to AYn fed from the external terminals. The aforementioned signal CS is kept at its high level for the first one-cycle period. As a result, the reading operations of first 8 bits is conducted like the aforementioned static column mode. Since the high-speed access is realized in the page mode, the column address switching operation is conducted in synchronism with the clock signal. In the present embodiment, the aforementioned signal CS is used as the clock signal for the aforementioned address switching operation.

The reading operations of the data of 8 bits corresponding to the second column address will be described in the following.

The internal row address signal does not change and is latched by the latch circuit not shown in the drawing until the signal $\overline{CE}$ is raised to the high level again.

The signals cs1 and $\overline{cs1}$ are not changed even with the change in the signal CS because they are produced on the basis of the signals latches by the circuits IV19 and IV20. As a result, the circuits at the side of the external terminals AY are left operative in the address buffer C-ADB. Moreover, the signal ce1 is kept at its high level.

In this state, the signal CS is dropped to its low level. In response to this, the clock signal $\phi_{cs}$ (or $\overline{\phi}_{cs}$) is dropped to its low level (or raised to its high level). As a result, the latch circuit has its circuit IV1 rendered inoperative and its feedback circuit IV3 rendered operative. As a result, the address signals AY fed from the external terminals are rendered ineffective to once latch the address signal incorporated previously. Next, since the signal CS is changed from its low to high levels, the circuits IV1 and IV3 are temporarily rendered operative and inoperative, respectively, at that timing. As a result, at the rising edge of the signal CS to the high level, the new address signals AY (e.g., AY0 to AYn)

fed from the external terminals are incorporated and latched, and the internal address signals are produced by the output signal of that latch circuit. Since the column address switching operation can be conducted without considering the skew of the column address signal by the external address signal incorporating method by that timing signal, it is possible to realize the high-speed continuous access (in the page mode). In the case of the writing operation, incidentally, the continuous writing operation can be executed by feeding the write signal Din to the external terminals D in synchronism with the signal CS.

Figure 9:
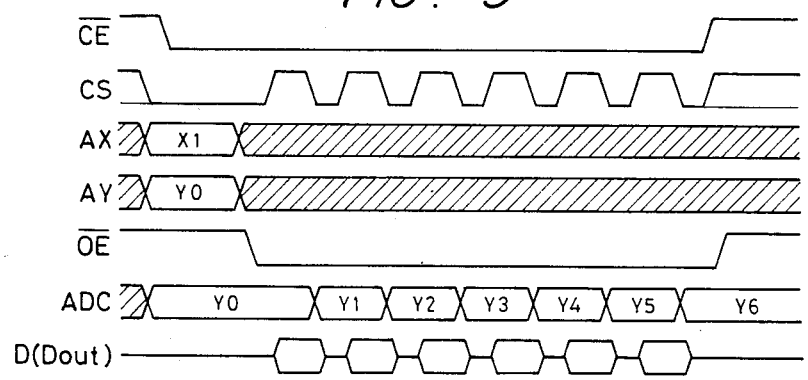
FIG. 9 is a timing chart for explaining a high-speed serial mode, i.e., still another operation of the pseudo static RAM of FIG. 1.

In FIG. 9, there is shown a timing chart for describing the reading operation in a high-speed serial mode (i.e., an extended nibble mode).

If the signal CS is at its low level at the timing where the signal $\overline{CE}$ is changed from its high to low levels, the access mode by the address signal produced in the internal circuit is performed (i.e., the high-speed serial mode).

By the operations like those of the example of FIG. 7, the internal row address signals are produced and latched by the latch circuits so that one word line W is selected. The timing signals ce1, $\overline{ce1}$, ce2 and ce3 are also generated like those of the example of FIG. 7.

In response to the high level of the signal ce3, the low level of the signal CS is incorporated through the circuit NG5 into the input of the circuit IV19. By the high and low levels of the signals ce1 and $\overline{ce1}$, the circuits IV18 and IV19 are rendered inoperative and operative, respectively. As a result, the signals CS1 and $\overline{CS1}$ are set at the low and high levels, respectively. At a faster timing, the signals $\phi_{cs}$ and $\overline{\phi}_{cs}$ are set at the high and low levels. The signal $\phi'_{cs}$ is temporarily raised to its high level by the high level of the one-shot signal ce2 and the signal $\overline{CS1}$.

The productions of the column addresses are conducted in the following manners.

For a time period after the signal ce3 is raised to its high level and until the signal CS1 falls to the low level and the signal $\overline{\phi}_{cs}$ is raised to the high level, the external address signals AY0 to AYn are fed to the circuit IV5 and so on when the MOSFETs Q1 and Q4 are turned on. As a result, the internal column address signals ay0 to ayn are produced. Of these signals, the non-inverted internal address signals ay0 to ayn are incorporated as the initial values to the address counter circuit ADC by the high level of the timing signal $\phi'_{cs}$.

Next, the signals CS1 and $\overline{\phi}_{cs}$ are set substantially simultaneously at the low and high levels, respectively. In response to the high level of the signal $\overline{\phi}_{cs}$ and the low level of the signal $\phi_{cs}$, the circuits IV1 and IV3 are rendered operative and inoperative, respectively. In other words, the address signals are incorporated and latched. In response to the low level of the signal CS, on the other hand, the multiplexer circuit has its control signals cs1 and $\overline{cs1}$ set at the low and high levels, respectively. As a result, the P-channel MOSFET Q5 and the N-channel MOSFET Q8 are turned on so that the multiplexer circuit has its circuits rendered operative at the side of the address counter circuit ADC. As a result, the inverted signals $\overline{ay0}$ to $\overline{ayn}$ of the signals incorporated as the initial values into the address counter circuit are fed to the address buffer C-ADB. Incidentally, the signal $\phi_y$ may be raised to its high level at that timing.

Next, at the timing where the signal CS is raised to its high level again, the selecting operations of the column system are started. In response to the low level of the signal $\overline{\phi}_{cs}$ (i.e., the high level of the signal $\phi_{cs}$) by the signal CS, the latch circuit has its circuits IV1 and IV3 rendered temporarily operative and inoperative, respectively. As a result, the address signals ay0 to ayn corresponding to the aforementioned initial address signals are incorporated and latched so that the internal address signals ay0 to ayn are produced by the output signal of that latch circuit. After the column addresses have been fixed, on the basis of the signal $\overline{CE}$, there is generated the signal $\phi_y$ which is suitably delayed from the former signal. As a result, the column address decoder circuit C-DCR1 or C-DCR2 decodes those address signals to produce the data line selecting signals. Of the memory cells coupled to the word lines selected in accordance with the address signals AX having already been incorporated, the memory cell coupled to the data line selected by the aforementioned address signal $\overline{ay0}'$ to $\overline{ayn}'$ has its information sent out to the external terminals D. As a result, the reading operations of the first 8 bits are conducted in accordance with the address Y0. In the high-speed serial mode, the switching operation of the column addresses is conducted by incrementing the internal address signals so as to realize the high-speed access. In the present embodiment, the aforementioned signal CS is used as the clock signal for incrementing the internal address signals.

The reading operations of the data of 8 bits corresponding to the second column address are conducted in the following manners.

The internal row address signals are not changed but are latched in the not-shown latch circuit until the signal $\overline{CE}$ restores its high level.

The signals CS1 and $\overline{CS1}$ are not changed with the change in the signal CS because they are produced on the basis of the signals latched by the circuits IV19 and IV20. As a result, the address buffer C-ADB has its circuits left operative at the side of the address counter circuit ADC.

In this state, the signal CS is dropped again to its low level. In response to this, the clock signals $\phi_{cs}$ and $\overline{\phi}_{cs}$ are set at the low and high levels, respectively. In synchronism with the rise of the signal $\overline{\phi}_{cs}$ (or the fall of the signal CS), the counting operation of the address counter circuit ADC is conducted so that its incremented internal address signal Y1 is transmitted to the input of the latch circuit. The signal CS is changed again from its low to high levels. At this timing, the latch circuit incorporates and latches the aforementioned incremented internal address signal Y1 in response to the signals $\phi_{cs}$ and $\overline{\phi}_{cs}$ so that the column internal address signals are changed. In accordance with this, the column switching operations are conducted to effect the continuous reading operations. Since, in this high-speed serial mode, it is unnecessary to consider the skew of the address signals as is different from the aforementioned static column mode where the address signals are fed from the external terminals, the access operations can be accordingly accelerated. In the writing operations, incidentally, the write signal Din may be fed to the external terminals D in synchronism with the aforementioned clocked serial signals.

According to the present invention, it is possible to attain the following effects.

It is possible to provide a semiconductor memory device which is enabled to have both the functions such as the static column mode of the asynchronous address switching operation and the serial access mode like the page mode, by providing a function to transmit address signals fed from external terminals as they are to the address buffers and a latch function to latch the address signals fed from the external terminals in synchronism with the edges of predetermined control signals fed from the external terminals.

The semiconductor memory device is also enabled to have a function to continuously access the memory cells at high speed without any consideration of the skew of the address signals by adding the multiplexer function to the address buffer to receive the address signals from the external terminals and the address signals produced in the inside so that they may be controlled by the external control terminals.

Thanks to the aforementioned effects, the most proper one can be selected from two or three kinds of continuous access modes in accordance with that system or the inoperative mode at each time.

Although our invention has been specifically described on the basis of its embodiment, it should not be limited to that embodiment but can be modified in various manners without departing from the gist thereof.

For example, the clocked serial signal CS may be composed of a plurality of signals such as a control signal for indicating the operation mode and a clock signal. Moreover, the specific circuits of the multiplexer, latch and address counter circuits can take a variety of embodiments.

Still moreover, the row and column address signals may be sequentially fed like the known dynamic RAM from the common external terminal by row address strobe signal $\overline{RAS}$ and the column address strobe signal $\overline{CAS}$. In this modification, the row address strobe signal $\overline{RAS}$ is used as the chip enable signal $\overline{CE}$. In addition to those signals $\overline{RAS}$ and $\overline{CAS}$, the clocked serial signal CS may be fed by adding an external terminal. Alternatively, the clock signals to be fed to the latch circuit disposed in the address buffer may be produced on the basis of the column address strobe signal $\overline{CAS}$. In this modification, either a control signal may be added so as to discriminate the aforementioned serial operation mode and page mode, or the mode may be indicated by combining the timings of the various signals ($\overline{RAS}$, $\overline{CAS}$ and $\overline{WE}$). Furthermore, a register may be disposed inside and written from the outside at a predetermined timing with data indicating the operation mode so that this operation mode may be determined in accordance with the content of the register.

The present invention can be applied not only to the dynamic RAM having at least the column selecting circuit constructed of the static circuit but also widely to a semiconductor memory such as a static RAM, a mask ROM or an EPROM.

What is claimed is:

1. A semiconductor memory comrpising:
    a memory array which includes word lines, data lines intersecting said word lines, and memory cells arranged corresponding to intersecting points of said word lines and said data lines;
    a first selection means for selecting one of said word lines;
    first external address terminals for receiving first external address signals;
    a first means for forming first internal address signals;
    a first external control terminal for receiving a first external control signal;
    internal control signals generating means coupled to said first external control terminal, and for generating internal control signals in accordance with said first external control signal;
    a second selection means coupled to said first external address terminals, to said first means and to a third selection means, and for selecting and providing one of the first external address signals and the first internal address signals as output signals to said third selection means in accordance with a first internal control signal 1110 of said internal control signals, wherein said third selection means includes means for selecting one of said data lines in accordance with the output signals provided from said second selection means; and
    an output means for outputting to an external data terminal information stored in a memory cell arranged corresponding to an intersecting point of the word line selected by said first selection means and the data line selected by said third selection means.

2. A semiconductor memory according to claim 1, further comprsing a second means coupled between said third selection means and said second selection means, for forming complementary column address signals, and for providing said complementary column address signals to said third selection means.

3. A semiconductor memory according to claim 2, wherein said second means includes a first latching means for latching the output signals provided from said second selection means in accordance with a second internal control signal of said internal control signals.

4. A semiconductor memory according to claim 3, wherein said first means is an address counter for serially forming said first internal address signals by a counting operation in synchronization with said second internal control signal, and said second means includes a third means for providing address signals to become an initial value of said address counter.

5. A semiconductor memory according to claim 4, wherein said internal control signals generating means includes a second latching means for latching said first external control signal in synchronization with a chip selection signal.

6. A semiconductor memory according to claim 5, further comprising a fourth means for providing the first external address signals to said second selection means in accordance with said chip selection signal.

7. A semiconductor memory according to claim 6, wherein said first selection means includes:
    a fifth means for forming second internal address signals;
    a fourth selection means coupled to said fifth means, to second external address terminals, and to a fifth selection means, and for selecting and providing one of second external address signals provided from said external second address terminals and the second internal address signals as output signals to said fifth selection means in accordance with a second control signal provided from a second external control terminal, wherein said fifth selection means includes means for selecting one of said word lines in accordance with the output signals provided from said fourth selection means.

8. A semiconductor memory according to claim 7, wherein said first selection means includes a sixth means coupled between said fourth selection means and said fifth selection means, for forming complementary row address signals, and for providing said complementary row address signals to said fifth selection means.

9. A semiconductor memory according to claim 8, wherein each of said memory cells includes a MOSFET and a capacitor connected in series.

10. A semiconductor memory according to claim 9, wherein said fifth means is a refresh circuit for generating the second internal address signals for indicating an address of predetermined memory cells to be refreshed.

* * * * *